(12) United States Patent
White

(10) Patent No.: US 8,432,724 B2
(45) Date of Patent: Apr. 30, 2013

(54) MEMORY ELEMENTS WITH SOFT ERROR UPSET IMMUNITY

(75) Inventor: Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 355 days.

(21) Appl. No.: 12/753,809

(22) Filed: Apr. 2, 2010

(65) Prior Publication Data

US 2011/0242880 A1    Oct. 6, 2011

(51) Int. Cl.
*G11C 11/00*   (2006.01)

(52) U.S. Cl.
USPC .......................................................... 365/154

(58) Field of Classification Search .................... 365/154
See application file for complete search history.

(56) References Cited

U.S. PATENT DOCUMENTS

| | | | |
|---|---|---|---|
| 3,863,229 A | 1/1975 | Gersbach | |
| 3,999,166 A | 12/1976 | Goser et al. | |
| 4,852,060 A | 7/1989 | Rockett, Jr. | |
| 6,744,661 B1 * | 6/2004 | Shubat | 365/156 |
| 7,233,518 B2 | 6/2007 | Liu | |
| 7,366,006 B2 | 4/2008 | Zhang | |
| 7,920,410 B1 * | 4/2011 | Lee et al. | 365/154 |
| 2002/0130348 A1 | 9/2002 | Tran | |
| 2006/0262612 A1 | 11/2006 | Lovett | |
| 2007/0041242 A1 | 2/2007 | Okazaki et al. | |
| 2008/0087927 A1 | 4/2008 | Shin et al. | |
| 2009/0080237 A1 | 3/2009 | Thomas | |
| 2010/0080033 A1 * | 4/2010 | Xu et al. | 365/72 |

OTHER PUBLICATIONS

Rahim, Irfan, et al. U.S. Appl. No. 12/571,346, filed Sep. 30, 2009.
Rahim, Irfan, et al. U.S. Appl. No. 12/568,638, filed Sep. 28, 2009.
Xu, Yanzhong, et al. U.S. Appl. No. 12/571,143, filed Sep. 30, 2009.
Lee, Andy, et al. U.S. Appl. No. 12/391,230, filed Feb. 23, 2009.
Hsieh, Chen-Ju, et al. U.S. Appl. No. 12/101,114, filed Apr. 10, 2008.
Calin, et al. "Upset Hardened Memory Design for Submicron CMOS Technology," IEEE Transactionso n Nuclear Science, vol. 43, No. 6, Dec. 1996.

* cited by examiner

*Primary Examiner* — Hoai V Ho
*Assistant Examiner* — Pablo Huerta
(74) *Attorney, Agent, or Firm* — Treyz Law Group; Jason Tsai

(57) ABSTRACT

Integrated circuits with memory cells are provided. A memory cell may have four inverter-like circuits connected in a ring configuration and four corresponding storage nodes. The four inverter-like circuits may form a storage portion of the memory cell. Some of the inverter-like circuits may have tri-state transistors in pull-up and pull-down paths. The tri-state transistors may be controlled by address signals. Address and access transistors may be coupled between some of the storages nodes and a data line. The address and access transistors may be used to read and write into the memory cell. During write operations, the address signals may be asserted to turn off the tri-state transistors and eliminate contention current from the cell. During read and normal operations, the address signals may be deasserted to allow the inverter-like circuits to hold the current state of the cell while providing soft error upset immunity.

20 Claims, 12 Drawing Sheets

MEMORY ELEMENTS WITH SOFT ERROR UPSET IMMUNITY

BACKGROUND

This relates to memory elements, and more particularly, to volatile memory elements that demonstrate soft error upset immunity for integrated circuits.

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless integrated circuits demonstrate good immunity to soft error upset events, they will be unsuitable for these types of applications.

It would therefore be desirable to be able to improve the soft error upset performance of volatile memory elements in integrated circuits.

SUMMARY

Integrated circuits with memory cells are provided. Integrated circuits may include control circuitry that controls a memory cell array. The control circuitry may include circuitry such as addressing circuitry, data register circuitry, and read/write circuitry.

The memory cell array may include groups of memory cells arranged in rows and columns. Each memory cell may have a storage portion that includes first, second, third, and fourth inverter-like circuits. The first and third inverter-like circuits may each have an n-channel transistor and a p-channel transistor coupled between a positive power supply line and a ground power supply line. The first and third inverter-like circuits may have first and third storage nodes at drain terminals of the n-channel and p-channel transistors of the first and third inverter-like circuits, respectively.

The second and fourth inverter-like circuits may each have first and second p-channel transistors and first and second n-channel transistors coupled between the positive power supply line and the ground power supply line. The first and second p-channel transistors of the second inverter-like circuit may be connected in series, and the first and second n-channel transistors of the second inverter-like circuit may be connected in series. The first and second p-channel transistors of the fourth inverter-like circuit may be connected in series, and the first and second n-channel transistors of the fourth inverter-like circuit may be connected in series. The second and fourth inverter-like circuits may have second and fourth storage nodes at the drain terminals of the first p-channel and the first re-channel transistors, respectively. If desired, more or less than four inverter-like circuits may be used to form the portion of the memory cell.

The p-channel transistors of the first and third inverter-like circuits may have gate terminals that are connected to the fourth and second storage nodes, respectively. The n-channel transistors of the first and third inverter-like circuits may have gate terminals that are connected to the second and fourth storage nodes, respectively.

The first p-channel transistors of the second and fourth inverter-like circuits may have gate terminals that are connected to the first and third storage nodes, respectively. The first n-channel transistors of the second and fourth inverter-like circuits may have gate terminals that are connected to the third and first storage nodes, respectively. The second p-channel transistors of the second and fourth inverter-like circuits may have gate terminals that are controlled by a true address signal. The second n-channel transistors of the second and fourth inverter-like circuits may have gate terminals that are controlled by a complementary address signal (i.e., an inverted version of the true address signal).

Memory cells with a storage circuit portion that is connected using this type of arrangement may exhibit soft error upset immunity. In one suitable arrangement, two address transistors may be coupled between the third storage node and a data line. The two address transistors may include an n-channel address transistor and a p-channel address transistor. The n-channel and p-channel access transistors may have gate terminals that are controlled by the true and complementary address signals, respectively. Two read/write access transistors may be coupled between the second storage node and the data line. The two access transistors may include an n-channel and a p-channel read/write transistor. The n-channel and p-channel read/write transistors may have gate terminals that are controlled by true and complementary read/write enable signals, respectively.

The address and access transistors may be connected to any number of storage nodes, if desired. Any number of address transistors may be used to write into the memory cell. Any number of access transistors may be used to write or read from the memory cell. If desired, a read buffer circuit may be used to provide enhanced read stability. The read buffer circuit may have a read transistor with a gate terminal that is connected to one of the internal storage nodes. A read buffer circuit connected using this approach may provide no read disturbance (e.g., no voltage rise at the internal node) during read operations.

Data may be written or read from the memory cell. During write operations, the address signals may be asserted to turn off the second n-channel and p-channel transistors in the second and fourth inverter-like circuits to place the second and fourth inverter-like circuits in a tri-state mode. Disabling these transistors during a write may eliminate any contention current and may allow the address and access transistors to be minimally sized and may still be able to write into the memory cell.

During read operations, the address signals may be deasserted to allow the four inverter-like circuits to function properly to hold its current state. The read access transistors may be enabled during read operations to charge or discharge the data line depending on the value of the stored bit.

Further features of the present invention, its nature and various advantages will be more apparent from the accompanying drawings and the following detailed description.

DETAILED DESCRIPTION

This relates to integrated circuit memory elements that are resistant to soft error upset events and to methods for using such memory elements. The memory elements, which are sometimes referred to as cells, may contain any suitable number of transistors.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
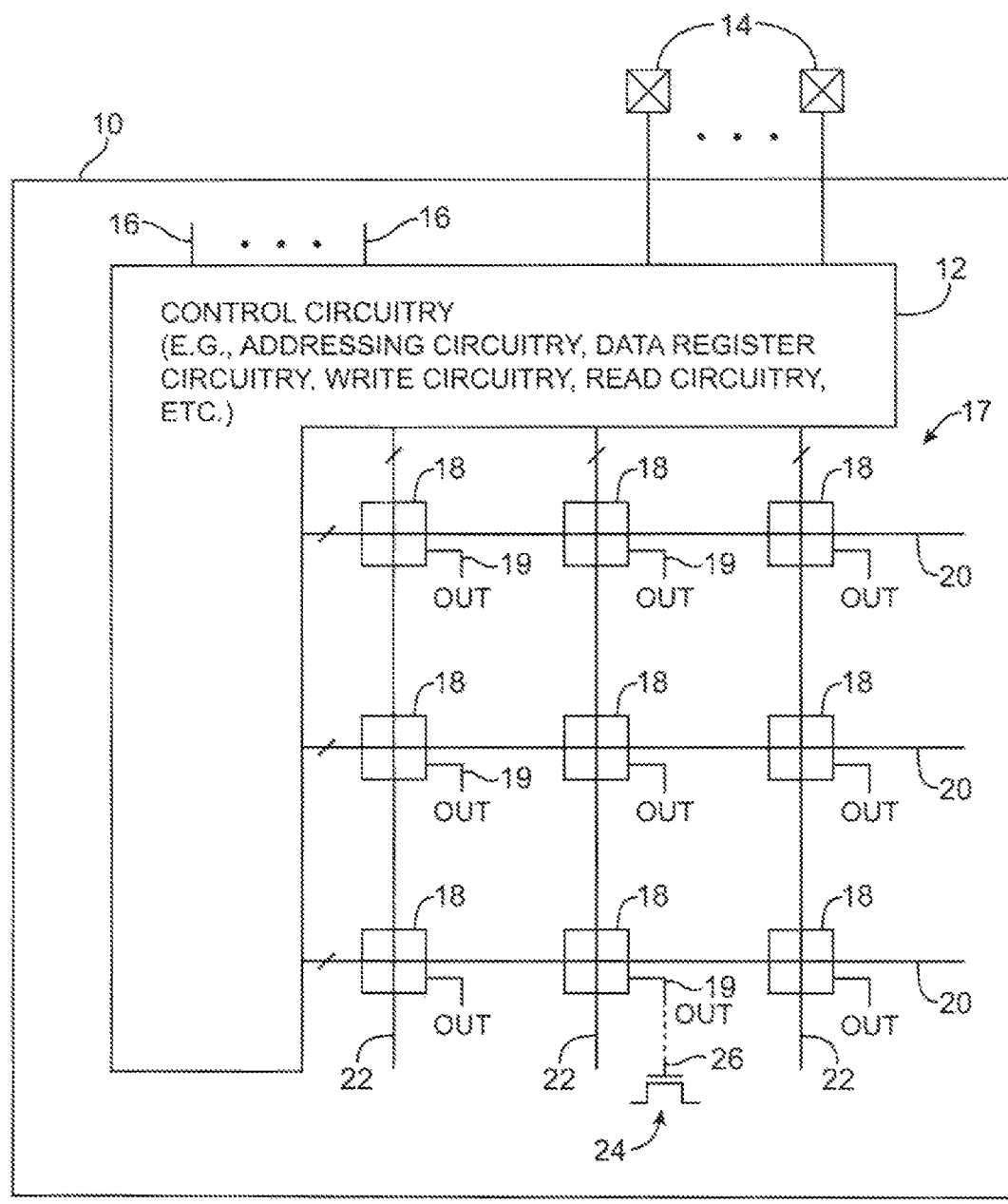
FIG. 1 is a diagram of an illustrative memory element array in accordance with an embodiment of the present invention.

FIG. 1 shows an integrated circuit that may include an array of memory elements (cells) 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

Each memory element may supply a corresponding output signal OUT at a corresponding output path 19. In CRAM arrays, each signal OUT is a static output control signal that may be conveyed over a corresponding path 26 and may be used in configuring a corresponding transistor such as transistor 24 or other circuit element in an associated programmable logic circuit.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and fixed signals on paths such as paths 20 and 22.

There may, in general, be any suitable number of conductive lines associated with paths 20 and 22. For example, each column of array 17 may have associated address lines (e.g., a true address line and a complement address line) and associated read/write enable lines in a respective one of paths 22 (as examples). Each row of array 17 may have a respective path 20 that includes a data line. A clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. This clear signal may also serve as a type of power signal by powering inverter-like circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, less than 0.9 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc-Vss) may also be used.

Figure 2:
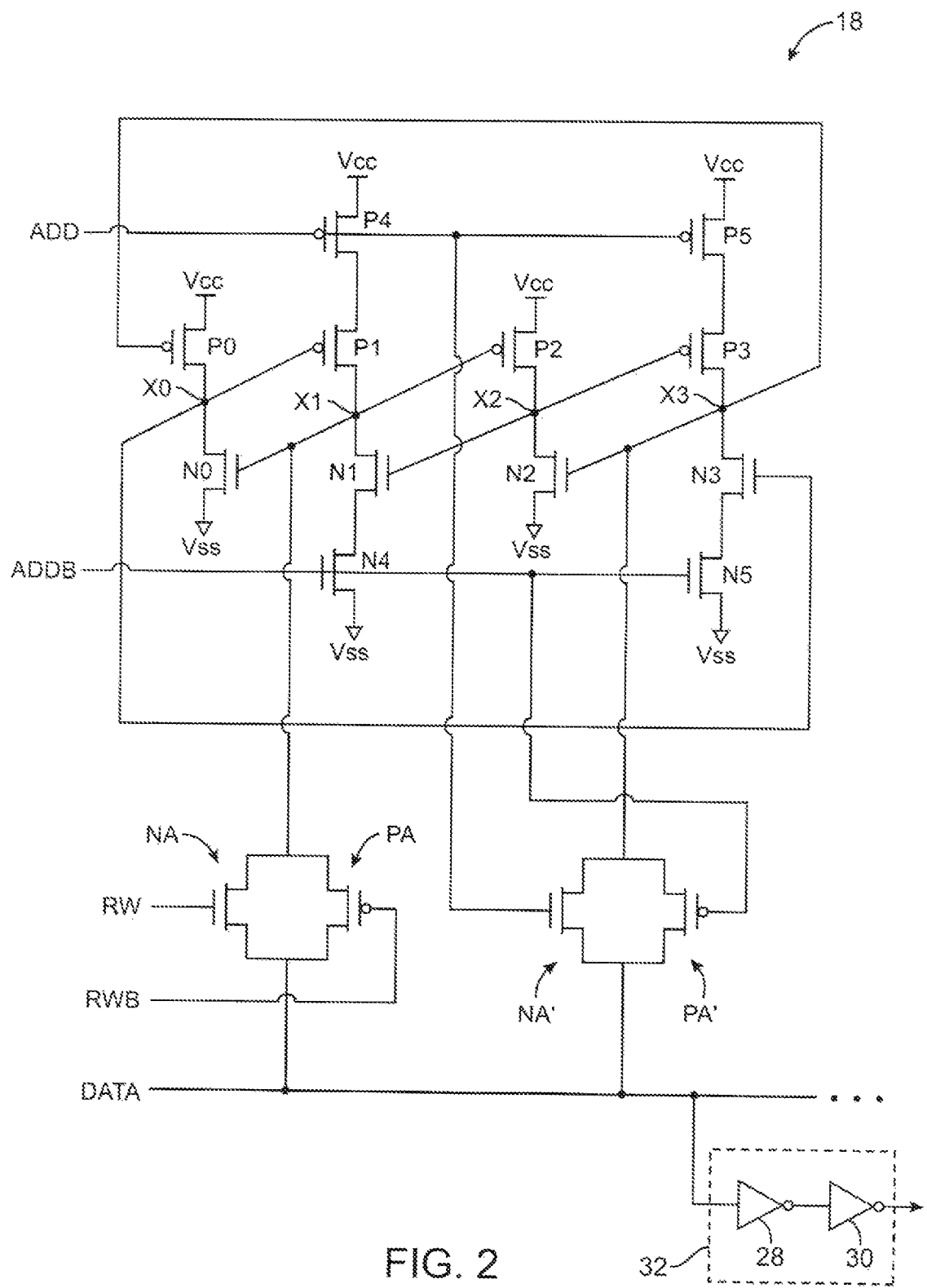
FIG. 2 is a circuit diagram of an illustrative memory cell with two transmission gates in accordance with an embodiment of the present invention.

FIG. 2 is a circuit diagram showing one suitable arrangement of memory cell 18. Memory cell 18 may include first, second, third, and fourth inverter-like circuits connected in a ring. The first inverter-like circuit may include a p-channel metal-oxide-semiconductor (PMOS) transistor such as PMOS transistor P0 and an n-channel metal-oxide-semiconductor (NMOS) transistor such as NMOS transistor N0. Transistors P0 and N0 may be coupled between the positive power supply line (i.e., a positive power supply terminal at positive power supply voltage Vcc) and the ground power supply line (i.e., a ground power supply terminal at ground voltage Vss). Transistor P0 may have a source terminal that is connected to the positive power supply line. Transistor N0 may have a source terminal that is connected to the ground line (i.e., the ground power supply line). Transistors P0 and N0 may each have a drain terminal that is connected to an intermediate node X0.

The second inverter-like circuit may include PMOS transistors P1 and P4 and NMOS transistors N1 and N4. Transistors P1 and P4 may be connected in series and may be coupled between the positive power supply line and an intermediate node X1. Transistors N1 and N4 may be connected in series with each other between intermediate node X1 and the ground line and may be connected in series with transistors P1 and P4.

The third inverter-like circuit may include PMOS transistor P2 and NMOS transistor N2. Transistors P2 and N2 may be coupled between the positive power supply line and the ground line. Transistors P2 and N2 may have source terminals that are connected to the positive power supply line and the ground line, respectively. Transistors P2 and N2 may each have a drain terminal that is connected to an intermediate node X2.

The fourth inverter-like circuit may include PMOS transistors P3 and P5 and NMOS transistors N3 and N5. Transistors P3 and P5 may be connected in series and may be coupled between the positive power supply line and an intermediate node X3. Transistors N3 and N5 may be connected in series and may be coupled between intermediate node X3 and the ground line. Transistors N3 and N5 may be connected in series with transistors P3 and P5.

Transistors P0-P5 may each have a body (bulk) terminal that is connected to an appropriate well bias such as the positive power supply line. Transistors N0-N5 may each have a body terminal that is connected to an appropriate well bias such as the ground line.

Transistors P0, P1, P2, and P3 may have gate terminals that are connected to intermediate nodes X3, X0, X1, and X2, respectively. Transistors N0, N1, N2, and N3 may have gate terminals that are connected to nodes X1, X2, X3, and X0, respectively. The connections described herein may be formed using metal routing wires such as M1 metal (e.g., a metal layer closest to the substrate) wire routing, M2 metal (e.g., a metal layer on top of the M1 metal layer) wire routing, etc.

Transistors P4 and P5 may have gate terminals that are controlled by a true address signal such as signal ADD provided over an associated address line. Transistors N4 and N5 may have gate terminals that are controlled by a complement address signal (e.g., a signal that is an inverted version of true signal ADD) such as signal ADDB provided over an associated complement address line. In this type of configuration, transistors P4 and P5 have a first channel type (i.e., transistors P4 and P5 have p-type channels) and this first channel type is the same as that of transistors P1 and P3 (i.e., P1 and P3 have the same channel type as transistors P4 and P5). Transistors N4 and N5 have the same channel type (n-type) as series-connected transistors N1 and N3.

During normal and read operations of memory array 17, signals ADD and ADDB may be deasserted (e.g., so that ADD is low and ADDB is high) to enable the second and fourth inverter-like circuits to function properly.

During write operations, signals ADD and ADDB may be asserted (e.g., so that ADD is high and ADDB is low) to turn off transistors P4, P5, N4, and N5. Turning off transistors P4, P5, N4, and N5 breaks the pull-up and pull-down current paths of the second and fourth inverter-like circuits. Breaking the pull-up and pull-down current paths in this way therefore allows nodes X1 and X3 to float, because no direct current path exists from the power supply lines to actively drive nodes X1 and X3. Transistors P4 and P5 may sometimes be referred to as tri-state pull-up transistors. Transistors N4 and N5 may sometimes be referred to as tri-state pull-down transistors. Asserting the address signals during write operations to place the second and fourth inverter-like circuits in this tri-state mode (tri-stating the second and fourth inverter-like circuits) helps allow memory cell 18 to be more easily overwritten with a desired data value.

Memory cell 18 may include address transistors such as NMOS transistor NA' and PMOS transistor PA', as shown in FIG. 2. Cell 18 may include read/write access transistors such as NMOS transistor NA and PMOS transistor PA. Transistors NA and PA may collectively be referred to as an access circuit. The terms "address" and "access" used to describe the transistors in a given memory may sometimes be used interchangeably. In the present discussion, however, the term address transistor is typically used to refer to transistors such as transistors PA' and NA' whose gates are controlled directly by address signals ADD and ADDB, whereas the term access transistor is typically used to refer to transistors such as transistors NA and PA whose gates are controlled by read-write control (enable) signals RW and RWB.

The address transistors may be disabled during normal operation (i.e., when each cell is holding its local data value and is applying a static control signal at its output) and during read operations and may be enabled (e.g., turned on) during write operations. The access transistors may be disabled during normal operation and may be enabled during read and write operations.

In general, a transistor has a source terminal, a drain terminal, a gate terminal, and a body terminal. The terms "source" and "drain" terminals may sometimes be used interchangeably. The sources and drains of the transistors of circuit 10 may sometimes be collectively referred to as "source-drain" terminals.

Transistors NA' and PA' may have first source-drain terminals connected to node X3 and second source-drain terminals connected to a data line. Signal DATA may be provided over the data line during read/write operations. Transistors NA' and PA' may have gate terminals that are controlled by signals ADD and ADDB, respectively.

Transistors NA and PA may have first source-drain terminals connected to node X1 and second source-drain terminals connected to the data line. Transistors NA and PA may have gate terminals that are controlled by true and complement read/write enable signals RW and RWB. Transistors such as transistors NA and PA that are arranged in this way may sometimes be referred to as read/write transmission gates. Transistors NA' and PA' may be referred to as address transmission gates. Transmission gates include an NMOS transistor and a PMOS transistor that are designed to have strong pull-down and pull-up drive strengths, respectively. Transmission gates may therefore be capable of driving circuit nodes to full CMOS (complementary metal-oxide-semiconductor) voltage levels (e.g., full high and full low voltage levels corresponding to the values of supply voltages Vcc and Vss, respectively).

Generally, any number of address and/or access transistors may be connected to any number of the intermediate nodes to provide desired read/write functionality and performance, if desired.

A read circuit such as read circuit 32 may be connected to the data line. Read circuit 32 may include two inverters such as inverters 28 and 30. During read operations, read circuit 32 may sense the value of signal DATA on the data line and may provide a read value at an output of inverter 30. Other read (sensing) schemes (e.g., read circuits with different numbers of transistors, a differential read scheme that uses sense amplifiers, etc.) may be used, if desired.

Transistors P0-P5 and N0-N5 as arranged in FIG. 2 may serve as a storage circuit (latch-type circuit) that stores data for the memory cell. Transistors P0-P5 and N0-N5 may therefore sometimes be referred to as forming a storage portion of memory cell 18. The storage portion may store data (in true and complement form) on intermediate nodes X0-X4. Intermediate nodes X0-X4 may therefore be referred to as internal storage nodes. Any of these nodes may be used as output 19 of FIG. 1. For example, node X3 may be connected to output 19 of FIG. 1.

Memory cell 18 may exhibit bistable operation. When cell 18 has been loaded with a "0," the values of X0, X1, X2, and X3 will be "1," "0,", "1," and "0," respectively. When memory element has been loaded with a "1," the values of X0, X1, X2, and X3 will be "0," "1,", "0," and "1," respectively.

In this context, the value stored at nodes X1 and X3 may represent a stored bit that currently retained by cell 18. Thus, writing a "0" into cell 18 may imply that a "0" is being written to storage nodes X1 and X3, while reading out a "1" may imply that storage nodes X1 and X3 are storing a "1" (as examples).

Unlike conventional memory element designs that are based on a pair of cross-coupled inverters, memory cell 18 of FIG. 2 has four inverter-like circuits that are connected in a ring. In conventional cross-coupled inverter designs, there is a relatively strong likelihood that a radiation strike on an inverter's input node will cause the inverter's output to change states, thereby flipping the state of the cell to an erroneous value. In the arrangement of FIG. 2, the gate of the p-channel transistor (e.g., transistors P0-P3) in each inverter-like circuit receives its input from a different source than the gate of the n-channel transistor in the same inverter-like circuit (e.g., transistors N0-N3). Because the control signals for the gates of the transistors are distributed in this way, memory cell 18 is better able to recover from a radiation strike on a particular node without flipping its state than conventional memory elements based on cross-coupled inverters.

During normal operation as CRAM memory, each cell 18 in array 17 may be used to provide a corresponding output signal OUT at its output line 19. The OUT signals may serve as static control signals that control programmable logic. In this mode of operation, the address signals ADD and ADDB and the read/write enable signals in each cell 18 are deasserted (e.g., ADD is low, ADDB is high, RW is low, and RWB is high), so that the address and access transistors are disabled. With the address transistors off, the data line will be isolated from the storage portion of cell 18 (i.e., transistors P0-P5 and N0-N5). Transistors P4 and P5 are turned on because ADD is low and transistors N4 and N5 are turned on because ADDB is high. The second and fourth inverter-like circuits of cell 18 are therefore active and cell 18 holds its loaded data value and exhibits good immunity to radiation-induced upset events.

Consider, as an example, the situation in which node X0 and node X2 are low ("0") and node X1 and node X3 are high ("1"). If radiation strikes node X0, radiation-induced charge on node X0 may cause the voltage on node X0 to go high (e.g., to positive power supply voltage Vcc or even higher). When the voltage on node X0 goes high, transistor N3 in the fourth inverter-like circuit turns on. The voltage on node X2 is low, so transistor P3 is already on. With both transistor N3 and P3 on, the voltage on node X3 falls to about Vcc/2 (i.e., midway between positive power supply voltage Vcc and ground voltage Vss).

The high X0 voltage that was produced by the radiation strike is routed to the gate of transistor P1. This turns off transistor P1. Transistor N1 has a gate controlled by the signal on node X2. Because node X2 is low, transistor N1 is off. When transistor P1 is turned off while transistor N1 is off, node X1 is no longer directly connected to either positive power supply voltage Vcc on the positive power supply line or ground voltage Vss on the ground power supply line. Node X1 therefore floats, retaining its original high state, despite the radiation strike.

The unperturbed signal on node X1 serves as a control signal that is applied to the gate of transistor P2. Before the radiation strike, node X1 was high and transistor P2 was off. After the radiation strike, node X1 retains its original high state, so the state of transistor P2 is unchanged. Transistor N2 is controlled by a reduced high voltage (Vcc/2), but is able to hold node X2 low, because transistor P2 remains off. As with the unperturbed signal on node X1, the voltage on node X2 is therefore unperturbed by the radiation strike.

Because the voltage on node X2 remains low, transistor P3 remains on and pulls node X3 high. Even though node X3 is momentarily reduced in voltage from Vcc to Vcc/2, the node X3 signal is still able to hold transistor P0 at least partially off, so that transistor N0, which is held on by unperturbed high signal on node X1, is able to pull node X0 low. Eventually, the radiation-induced charge on node X0 that momentarily elevated the voltage on node X0 will dissipate and node X0 will return to its normal (pre-strike) state of zero volts. Once X0 reaches zero volts, transistor N3 turns off and node X3 regains its pre-strike voltage of Vcc.

As this example demonstrates, the architecture of cell 18 allows the cell to retain its stored data value (a stored "1" in this example), even when a node in the cell is struck by radiation. The immunity of cell 18 to undesired changes in state from radiation strikes helps to ensure that array 17 will exhibit stable operation in a variety of circumstances. More or less than four inverter-like circuits may be used to form the storage portion of cell 18, if desired.

Figure 3:
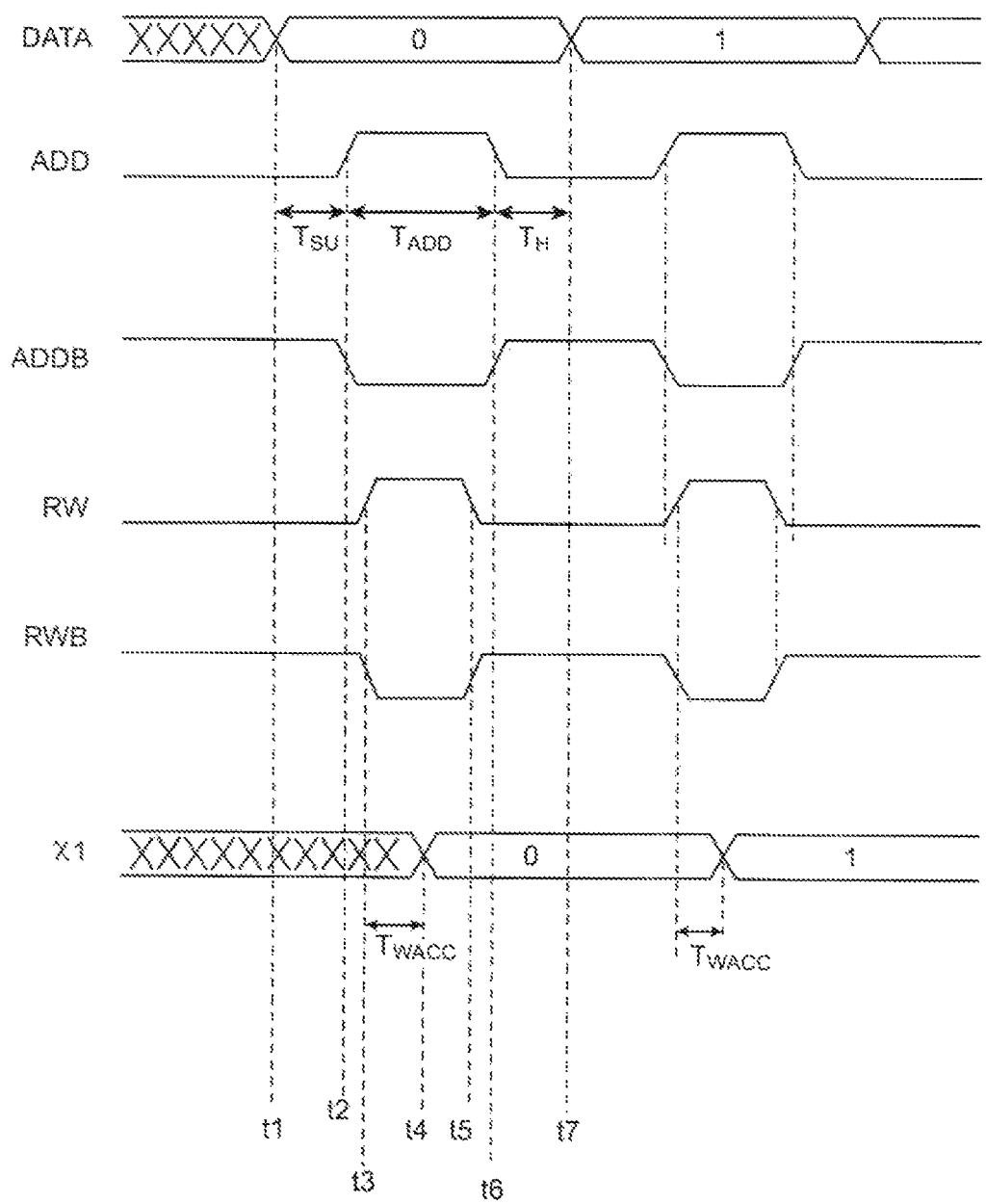
FIG. 3 is a timing diagram illustrating memory cell write operations in accordance with an embodiment of the present invention.

FIG. 3 shows a timing diagram that illustrates the process of writing into a desired memory cell in a given row. At time t1, desired data may be presented on a corresponding data line (e.g., signal DATA is driven low to write a "0"). At time t2, address and write enable signals may be deasserted (e.g., so that ADD is low, ADDB is high, RW is low, and RWB is high). All the inverter-like circuits in cell 18 may be active and cell 18 may be storing an unknown value at this time (see, e.g., node X1 in FIG. 3).

At time t2, the address signals may be asserted to disable the tri-state pull-up and pull-down transistors (e.g., to turn off transistors P4, P5, N4, and N5 in cell 18 of FIG. 2 and thereby tristate the second and fourth inverter-like circuits in cell 18). Asserting the address signals may also turn on transistors NA' and PA' to begin the write process.

At time t3, the write enable signals may be asserted (e.g., so that RW is high and RWB is low) to turn on transistors NA and PA. Enabling transistors NA, PA, NA', and PA' may provide sufficient strength to write the desired data into memory cell 18. Transistors NA, PA, NA', and PA' may be relatively small transistors (e.g., minimum-sized transistors), because the disabled tri-state transistors eliminate contention current from the power supply lines. With the second and fourth inverter-like circuits in a tristated condition, only half of the normal restoring force is available within cell 18, thereby facilitating write operations.

The transmission gates (e.g., transistors NA, PA, NA', and PA') may drive nodes X1 and X3 to the full CMOS voltage levels (e.g., supply voltage Vcc or Vss). Writing cell 18 in this way eliminates crowbar current (e.g., current flowing through an inverter-like circuit when its pull-up and pull-down circuits are at least partially on) that may flow through the first and third inverter-like circuits.

At time t4, node X1 may successfully be overwritten to store the desired value of "0." The time it takes to write into cell 18 after asserting the write enable signals (from time t3 to t4) may be referred to as write-access time $T_{WACC}$.

At time t5, the write enable signals may be deasserted. At time t6, the address signals may be deasserted. At time t7, signal DATA may change to a new value to write a "1" into another cell. The time from driving valid data on the data line to asserting the address signals (from time t1 to t2) may be referred to as setup time $T_{SU}$. The amount of time that the address signals are asserted may be referred to as address time $T_{ADD}$. The time from deasserting the address signals to driving a new value on the data line (from time t6 to t7) may be referred to as hold time $T_H$. Time periods $T_{SU}$, $T_{ADD}$, and $T_H$ may each be 100 ns in duration (as an example). Time periods $T_{SU}$, $T_{ADD}$, and $T_H$ may have any desired duration.

The timing diagram of FIG. 3 is merely illustrative. Any desired data value may be written into memory cell 18 using a similar timing scheme as shown in FIG. 3.

Figure 4:
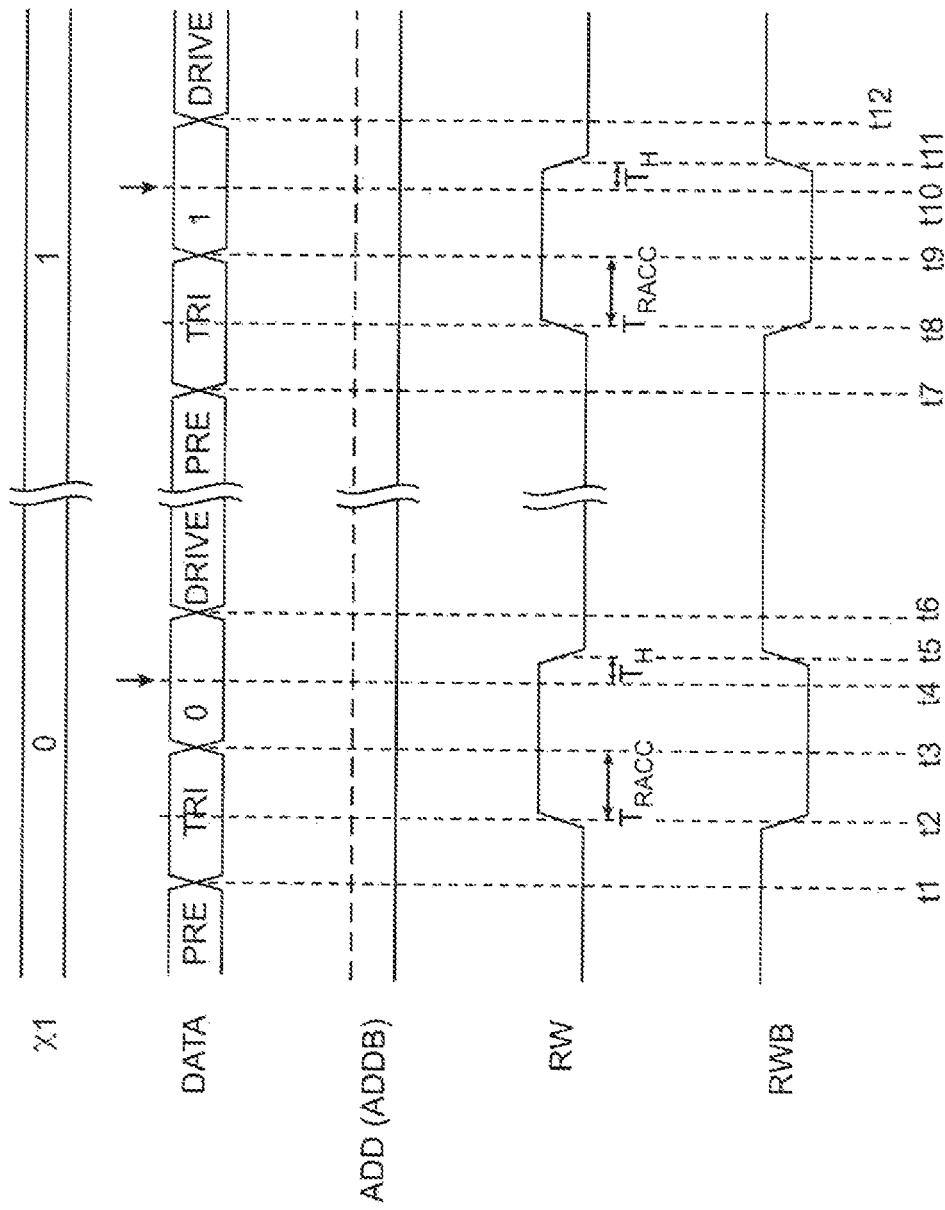
FIG. 4 is a timing diagram illustrating memory cell read operations in accordance with an embodiment of the present invention.

FIG. 4 shows a timing diagram that illustrates the process of reading data out of a desired memory cell. Reading from cell 18 may only disturb a single internal storage node (e.g., node X1), because the read access transistors may only be connected to the single storage node. Because cell 18 is immune to single storage node disturbances, reading from cell 18 using this approach will not inadvertently flip the current state of cell 18.

Consider a scenario in which memory cell 18 is storing a "0" (e.g., node X1 is storing a "0"). Precharge circuitry may precharge the data line to Vcc/2 prior to time t1 (as an example). Precharging the data line to Vcc/2 may minimize read disturbance at node X1 and may reduce dynamic switching power consumption assuming that cell 18 has equal likelihood of storing a "1" or "0." If desired, the data line may be precharge to supply voltage Vcc, Vss, or any desired voltage value.

At time t1, the precharge circuitry may be disabled and the data line may be placed in a tri-state mode in which the precharge voltage level (e.g., Vcc/2) is held by a data line capacitance. The data line may not be actively driven by the power supply lines in the tri-state mode. The read enable signals may be deasserted at this time (e.g., so that RW is low and RWB is high).

During read operations, the address signals may be deasserted to ensure that the four inverter-like circuits operate properly to hold the current state of the memory cell.

At time t2, the read enable signals may be asserted (e.g., so that RW is high and RWB is low). In this example, the data line may eventually be discharged by transistors NA and PA to ground (time t3). The amount of time from asserting the read enable signals to observing ground voltage Vss at the data line (e.g., from time t2 to t3) may be referred to as read-access time $T_{RACC}$.

At time t4, a read value corresponding to the value of storage node X1 may be sampled. At time t5, the read enable signals may be deasserted. The amount of time from the sampling of the read data to deassertion of the read enable signals may be referred to as hold time $T_H$. Hold time $T_H$ should be positive to ensure that data can be sampled properly. At time t6, data circuitry may drive the read data onto control circuitry 12 for further processing.

A logic "1" stored at node X1 may be read in a similar fashion, as shown in FIG. 4. The data line may be precharged to Vcc/2 prior to time t7. At time t7, the precharge circuitry may be disabled and the data line may be placed in the tri-state mode in which precharge voltage Vcc/2 is retained by the data line capacitance. The read enable signals may be deasserted at this time.

At time t8, the read enable signals may be asserted. In this scenario, the data line may eventually be charged up through transistors NA and PA to supply voltage Vcc (time t9). The amount of time from asserting the read enable signals to realizing positive supply voltage Vcc at the data line (from time t8 to t9) may also be referred to as read-access time $T_{RACC}$.

At time t10, a read value corresponding to the value of storage node X1 may be sampled. At time t11, the read enable signals may be deasserted. At time t12, the data circuitry may drive the read data onto control circuitry 12 for further processing.

The timing diagram of FIG. 4 is merely illustrative. Any desired data value may be read out from memory cell 18 using a similar timing scheme as shown in FIG. 4.

Figure 5:
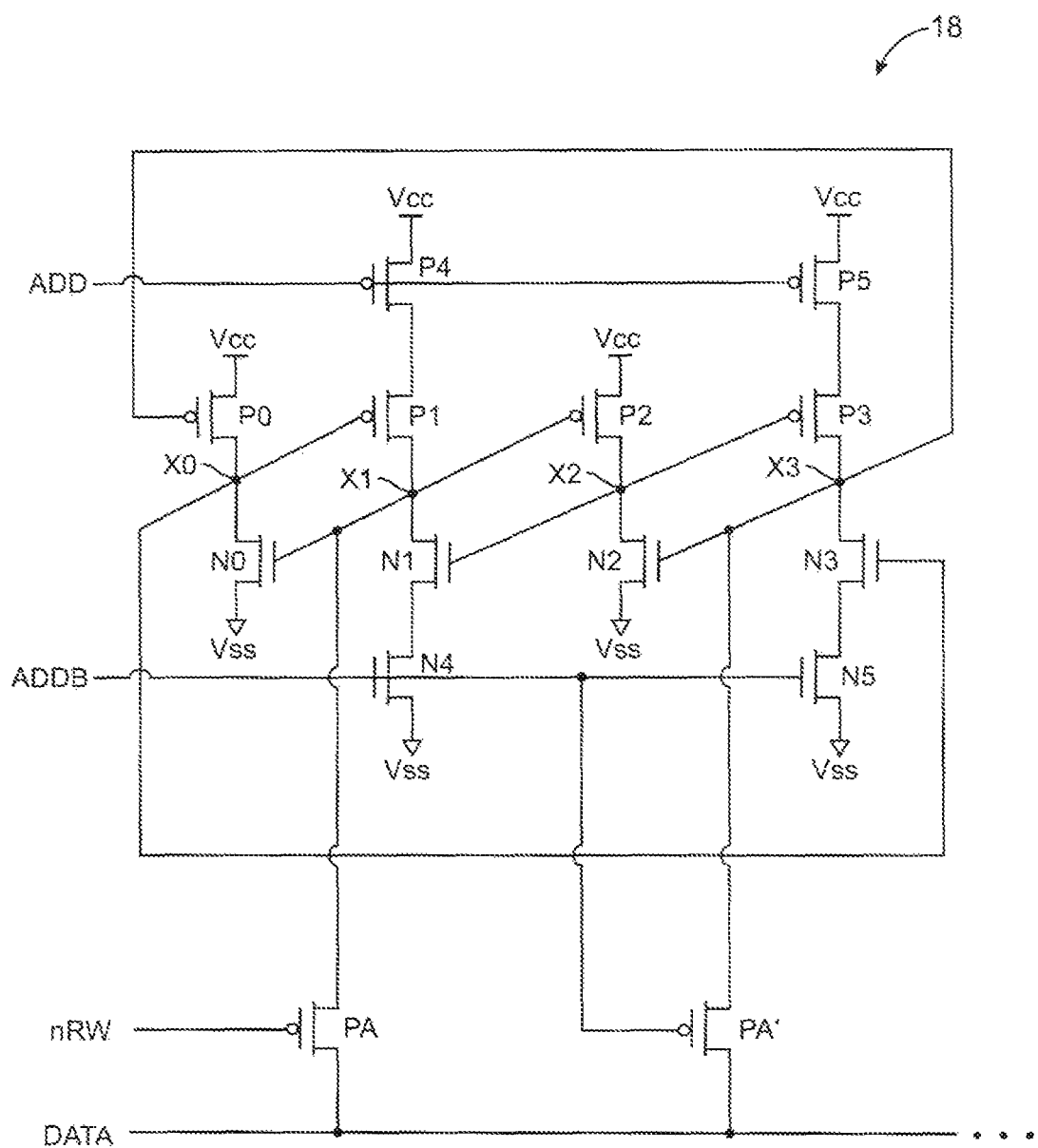
FIG. 5 is a circuit diagram of an illustrative memory cell with a p-channel address transistor and a p-channel read/write access transistor in accordance with an embodiment of the present invention.

FIG. 5 shows another suitable arrangement that may be used for memory cell 18. The storage portion of cell 18 in FIG. 5 (e.g., the circuitry based on transistors P0-P5 and N0-N5) is the same as that of FIG. 2. Memory cell 18 of FIG. 5 may include one PMOS address transistor PA' and one PMOS read/write access transistor PA. Address transistor PA' may have a first source-drain terminal connected to node X3, a second source-drain terminal connected to the data line, and a gate terminal that is controlled by signal ADDB. Access transistor PA may have a first source-drain terminal connected to node X1, a second source-drain terminal connected to the data line, and a gate terminal that is controlled by a read/write enable signal such as signal nRW.

Memory cell 18 of FIG. 5 operates in a similar fashion to the memory cell of FIG. 2. Data signal DATA and address signals ADD and ADDB may be controlled using a similar timing scheme as described in connection with FIGS. 3 and 4. Signal nRW may behave like signal RWB to enable or disable access transistor PA during read/write operations.

Memory cell such as memory cell 18 of FIG. 5 may include fewer transistors than the memory cell of FIG. 2. Memory cells such as memory cell 18 of FIG. 5 may also require fewer control signals (e.g., ADD, ADDB, and nRW) than the memory cell of FIG. 2.

Transistors PA and PA' may be able to drive storage nodes X1 and X3 to a full high voltage level (e.g., to power supply voltage Vcc) when writing a "1," because PMOS transistors are capable of pulling up to the positive power supply voltage. Transistors PA and PA' may drive storage nodes X1 and X3 down to a quasi-low voltage (e.g., Vss+Vtp) when writing a "0," because PMOS transistors can only pull down to as low as a threshold voltage level Vtp above its gate voltage level. In this type of situation, some crowbar current may flow through the first and third inverter-like circuits, because transistors N0 and N2 are partially on.

During read mode, access transistor PA may pull up the data line to the full high voltage level when reading a "1." Transistor PA may pull the data line down to the quasi-low voltage (i.e., Vss+Vtp) when reading a "0." In general, signal DATA will be either be the full high voltage level or the quasi-low voltage depending on the state of the stored bit.

Figure 6:
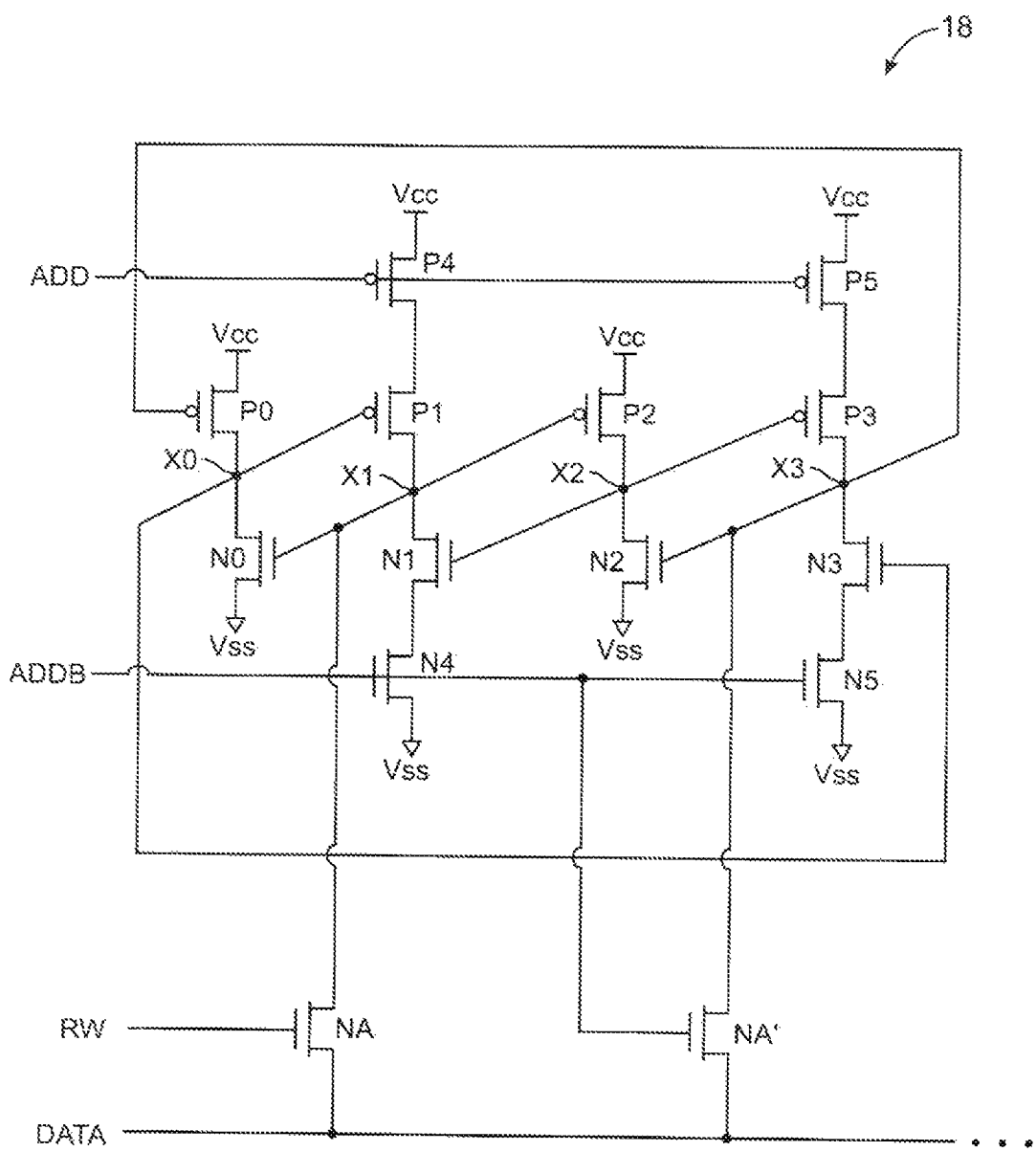
FIG. 6 is a circuit diagram of an illustrative memory cell with an n-channel address transistor and an re-channel read/write access transistor in accordance with an embodiment of the present invention.

FIG. 6 shows another suitable arrangement for memory cell 18. The storage portion of cell 18 in FIG. 6 may remain the same as that of FIG. 2. Memory cell 18 of FIG. 6 may include one NMOS address transistor NA' and one NMOS read/write access transistor NA. Address transistor NA' may have a first source-drain terminal connected to node X3, a second source-drain terminal connected to the data line, and a gate terminal that is controlled by signal ADD. Access transistor NA may have a first source-drain terminal connected to node X1, a second source-drain terminal connected to the data line, and a gate terminal that is controlled by a read/write enable signal such as signal RW.

Memory cell 18 of FIG. 6 may operate similarly to the memory cell of FIG. 2. Data signal DATA, enable signal RW, and address signals ADD and ADDB may be controlled using a timing scheme of the general type described in connection with FIGS. 3 and 4.

Memory cell 18 of FIG. 6 may have fewer transistors than the memory cell of FIG. 2. Memory cell 18 of FIG. 6 may also require fewer control signals (e.g., ADD, ADDB, and RW) than the memory cell of FIG. 2.

Transistors NA and NA' may drive storage nodes X1 and X3 to the full low voltage level when writing a "0," because NMOS transistors are capable of pulling down to zero volts. Transistors NA and NA' may be able to drive storage nodes X1 and X3 up to a quasi-high voltage (e.g., Vcc–Vtn) when writing a "1," because NMOS transistors can only pull up to as high as threshold voltage level Vtn below its gate voltage level. This may cause some crowbar current to flow through the first and third inverter-like circuits, because transistors P0 and P2 are partially on.

During read mode, access transistor NA may discharge the data line to the full low voltage level when reading a "0." Transistor NA may charge the data line up to the quasi-high voltage (i.e., Vcc–Vtn) when reading a "1." In general, signal DATA will be either voltage Vss or (Vcc–Vtn) depending on the state of the stored bit.

Figure 7:
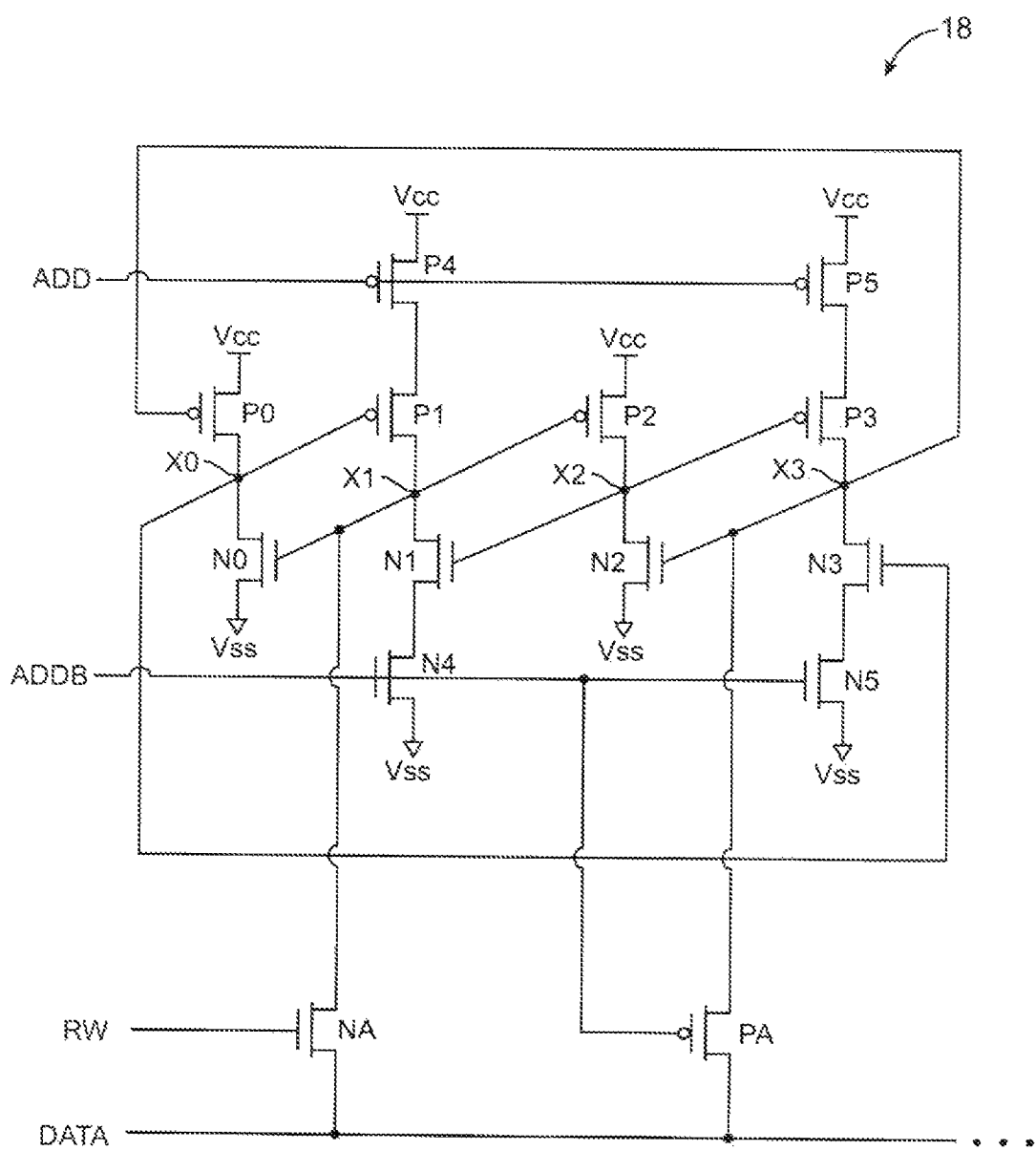
FIG. 7 is a circuit diagram of an illustrative memory cell with a p-channel address transistor and an re-channel read/write access transistor in accordance with an embodiment of the present invention.

FIG. 7 shows another suitable arrangement for memory cell 18. The storage portion of cell 18 in FIG. 7 is the same as that of FIG. 2. Memory cell 18 of FIG. 7 may include one PMOS address transistor PA and one NMOS read/write access transistor NA. Address transistor PA may have a first source-drain terminal connected to node X3, a second source-drain terminal connected to the data line, and a gate terminal that is controlled by signal ADDB. Access transistor NA may have a first source-drain terminal connected to node X1, a second source-drain terminal connected to the data line, and a gate terminal that is controlled by a read/write enable signal such as signal RW.

Memory cell 18 of FIG. 7 may operate in a similar way to the memory cell of FIG. 2. Data signal DATA, enable signal RW, and address signals ADD and ADDB may be controlled using a timing scheme of the type described in connection with FIGS. 3 and 4.

Memory cell 18 of FIG. 7 may have fewer transistors than the memory cell of FIG. 2. Memory cell 18 of FIG. 7 may also require fewer control signals (e.g., signals ADD, ADDB, and RW) than the memory cell of FIG. 2.

Transistor PA may drive storage node X3 to a full high voltage level (e.g., Vcc) when writing a "1." Transistor NA may drive storage node X1 up to the quasi-high voltage (e.g., Vcc–Vtn) when writing a "1." This may cause crowbar current to flow through the third inverter-like circuit, because transistor P2 is partially on.

Transistor NA may be able to drive storage node X1 to the full low voltage level (e.g., Vss) when writing a "0." Transistor PA may drive storage node X3 down to the quasi-low voltage level (e.g., Vss+Vtp) when writing a "0." This may result in crowbar current flowing through the third inverter-like circuit, because transistor N2 is partially on.

There may be no crowbar current flowing through the first inverter-like circuit during write operations, because node X3 is driven to the full high voltage level during a write "1" and node X1 is driven to the full low voltage level during a write "0," thereby completely turning off transistors P0 and N0, respectively.

During read mode, access transistor NA may discharge the data line to the full low voltage level when reading a "0." Transistor NA may charge the data line up to the quasi-high voltage level when reading a "1." In general signal DATA will be either voltage Vss or (Vcc–Vtn) depending on the state of the stored bit.

Figure 8:
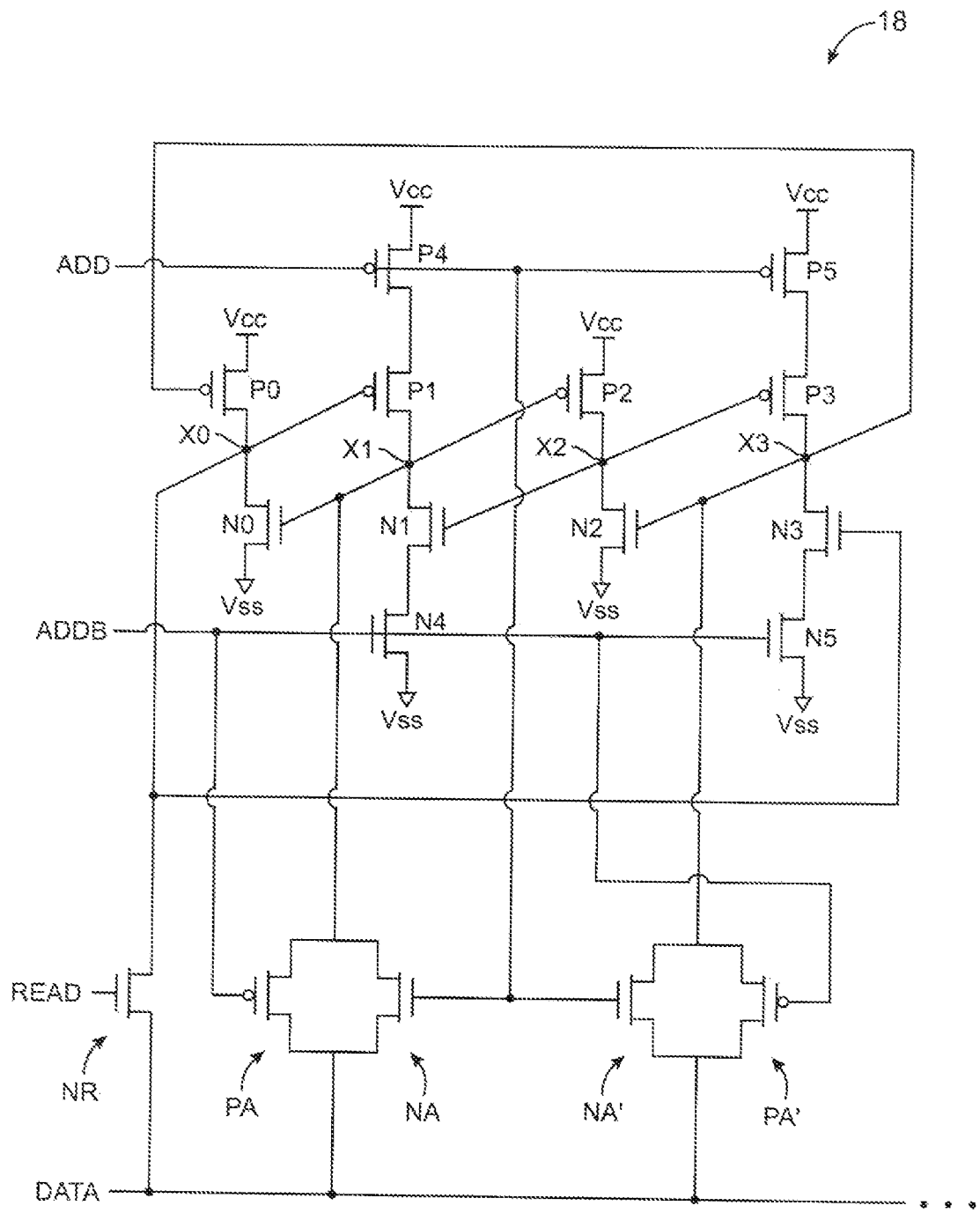
FIG. 8 is a circuit diagram of an illustrative memory cell with two write transmission gates and a read transistor in accordance with an embodiment of the present invention.

FIG. 8 shows another suitable arrangement for memory cell 18. The storage portion of cell 18 in FIG. 8 may be the same as that of FIG. 2. Memory cell 18 of FIG. 8 may include four address transistors NA, PA, NA', and PA' and a read circuit that includes one NMOS read access transistor NR. Address transistor NA may have a first source-drain terminal connected to node X1, a second source-drain terminal connected to the data line, and a gate terminal that is controlled by signal ADD. Access transistor PA may have a first source-drain terminal connected to node X1, a second source-drain terminal connected to the data line, and a gate terminal that is controlled by signal ADDB. Address transistor NA' may have a first source-drain terminal connected to node X3, a second source-drain terminal connected to the data line, and a gate terminal that is controlled by signal ADD. Access transistor PA' may have a first source-drain terminal connected to node X3, a second source-drain terminal connected to the data line, and a gate terminal that is controlled by signal ADDB.

Memory cell 18 of FIG. 8 may operate in a similar way to the memory cell of FIG. 2. Data signal DATA and address signals ADD and ADDB may be controlled using a timing scheme of the type described in connection with FIGS. 3 and 4. Signal READ may behave like signal RW to enable or disable access transistor NR during read/write operations.

Memory cell 18 of FIG. 8 may have an additional dedicated read transistor compared to the memory cell of FIG. 2. Memory cell 18 of FIG. 8 may require fewer control signals (e.g., ADD, ADDB, and READ) than the memory cell of FIG. 2.

The address transistors shown in FIG. 8 behave like transmission gates that can drive storage nodes X1 and X3 to a full high voltage level (e.g., Vcc) when writing a "1" and to the full low voltage level (e.g., Vss) when writing a "0." Writing cell 18 in this way prevents crowbar currents from flowing in the first and third inverter-like circuits.

During read mode, read transistor NR may discharge the data line to the full low voltage level when reading a "0." Transistor NR may charge the data line up to the quasi-high voltage when reading a "1." In general signal DATA will be either voltage Vss or (Vcc−Vtn) depending on the state of the stored bit.

Cell 18 of FIG. 8 may have a stronger read drive strength compared to the memory cell of FIG. 2. When reading a "1" or "0," a read current will only have to flow through two series-connected transistors in cell 18 of FIG. 8 while the read current will have to flow through three series-connected transistors in cell 18 of FIG. 2. This potential performance enhancement is provided by reading values out of nodes X0 and X2 instead of nodes X1 and X3, because the first and third inverter-like circuits have fewer pull-up and pull-down transistors than the second and fourth inverter-like circuits. In general, currents that flow through a fewer number of transistors experience less resistance and therefore exhibit improved performance (e.g., higher on current values).

Figure 9:
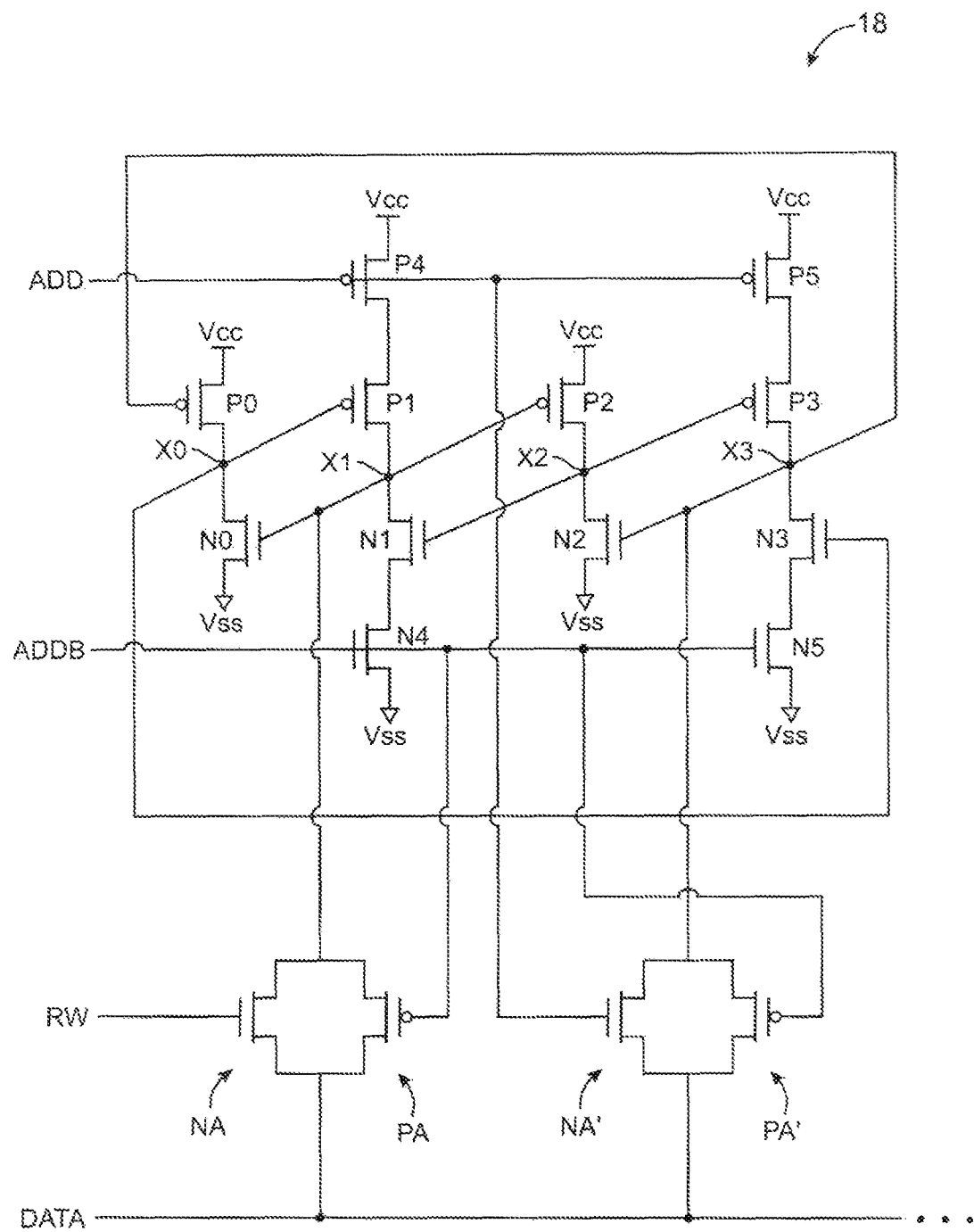
FIG. 9 is a circuit diagram of an illustrative memory cell with an address transmission gate and an n-channel read/write access transistor in accordance with an embodiment of the present invention.

FIG. 9 shows another suitable configuration for memory cell 18. The storage portion of cell 18 of FIG. 9 may be the same as that of FIG. 2. Memory cell 18 of FIG. 9 may include three address transistors PA, NA', and PA' and one NMOS access transistor NA. Address transistor PA may have a first source-drain terminal connected to node X1, a second source-drain terminal connected to the data line, and a gate terminal that is controlled by signal ADDB. Address transistor NA' may have a first source-drain terminal connected to node X3, a second source-drain terminal connected to the data line, and a gate terminal that is controlled by signal ADD. Access transistor PA' may have a first source-drain terminal connected to node X3, a second source-drain terminal connected to the data line, and a gate terminal that is controlled by signal ADDB.

Memory cell 18 of FIG. 9 may operate similarly to the memory cell of FIG. 2. Data signal DATA, address signals ADD and ADDB, and read/write enable signal RW may be controlled using a timing scheme of the type described in connection with FIGS. 3 and 4.

Memory cell 18 of FIG. 9 may include the same number of transistors as that of memory cell 18 of FIG. 2, but may require fewer control signals (e.g., ADD, ADDB, and RW) than the memory cell of FIG. 2.

The address and access transistor NA shown in FIG. 9 may behave like transmission gates that drive storage nodes X1 and X3 to the full high voltage level when writing a "1" and to the full low voltage level when writing a "0." Access transistor NA may be enabled during write mode. Writing cell 18 in this way eliminates crowbar currents from flowing in the first and third inverter-like circuits.

During read mode, access transistor NA may discharge the data line to the full low voltage level when reading a "0." Transistor NA may charge the data line up to the quasi-high voltage when reading a "1."

Figure 10:
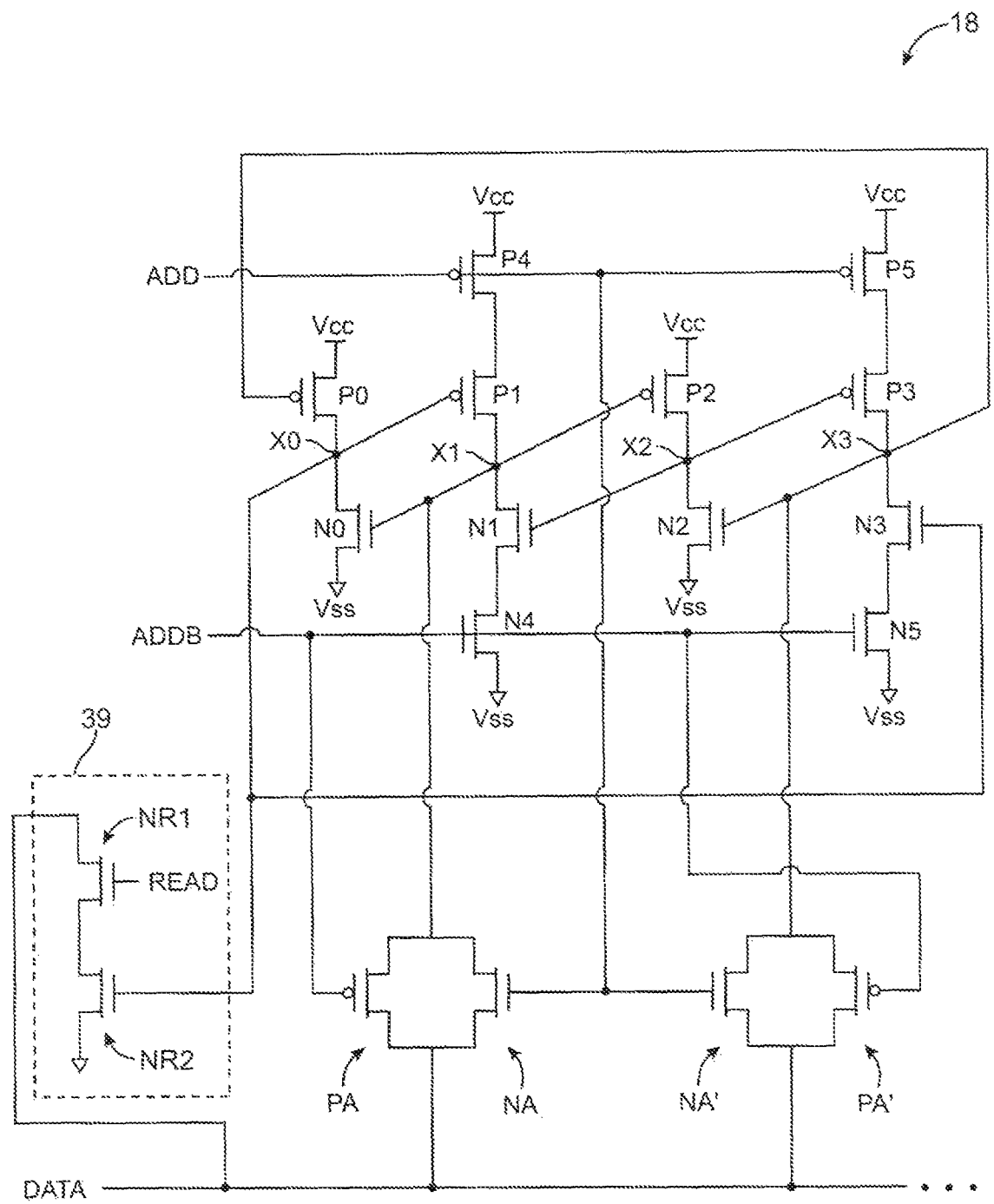
FIG. 10 is a circuit diagram of an illustrative memory cell with two write transmission gates and a read buffer circuit in accordance with an embodiment of the present invention.

FIG. 10 shows another suitable arrangement for memory cell 18. The storage portion of cell 18 in FIG. 10 may be the same as that of FIG. 2. Memory cell 18 of FIG. 10 may include four address transistors NA, PA, NA', and PA' and a read circuit such as read buffer circuit 39. Address transistor NA may have a first source-drain terminal connected to node X1, a second source-drain terminal connected to the data line, and a gate terminal that is controlled by signal ADD. Address transistor PA may have a first source-drain terminal connected to node X1, a second source-drain terminal connected to the data line, and a gate terminal that is controlled by signal ADDB. Address transistor NA' may have a first source-drain terminal connected to node X3, a second source-drain terminal connected to the data line, and a gate terminal that is controlled by signal ADD. Address transistor PA' may have a first source-drain terminal connected to node X3, a second source-drain terminal connected to the data line, and a gate terminal that is controlled by signal ADDB.

Memory cell 18 of FIG. 10 may operate similarly to the memory cell of FIG. 2. Data signal DATA and address signals ADD and ADDB may be controlled using a timing scheme of the type described in connection with FIGS. 3 and 4. Signal READ may behave like signal RW to enable or disable access transistor NR during read operations.

Buffer circuit 39 may include two series-connected NMOS transistors NR1 and NR2. Transistors NR1 and NR2 may be coupled between the data line and the ground line. Transistor NR1 may have a gate terminal that is controlled by signal READ while transistor NR2 may have a gate terminal that is connected to node X0. If desired, read buffer circuit 39 may be connected to a different internal storage node. Memory cell 18 of FIG. 5 may require fewer control signals (e.g., ADD, ADDB, and READ) than the memory cell of FIG. 2.

The address transistors shown in FIG. 10 may behave like transmission gates that drive storage nodes X1 and X3 to the full high voltage level when writing a "1" and to the full low voltage level when writing a "0." Writing cell 18 in this way eliminates crowbar currents that may flow through the first and third inverter-like circuits.

During read mode, the data line may be precharged to positive power supply voltage Vcc (as an example). Buffer circuit 39 may discharge the data line to zero volts when reading a "1" (e.g., node X0 is storing a "0"). The data line may remain high when reading a "0" (e.g., node X0 is storing a "1"). Reading cell 18 in this way provides no read disturb (e.g., a negligible voltage rise at corresponding internal node X0), because the internal node X0 is connected to the gate terminal of transistor NR2 in read buffer circuit 39. The read buffer circuit shown in FIG. 10 is merely illustrative. Other types of buffer circuits that provides zero read disturb may be used, if desired.

Figure 11:
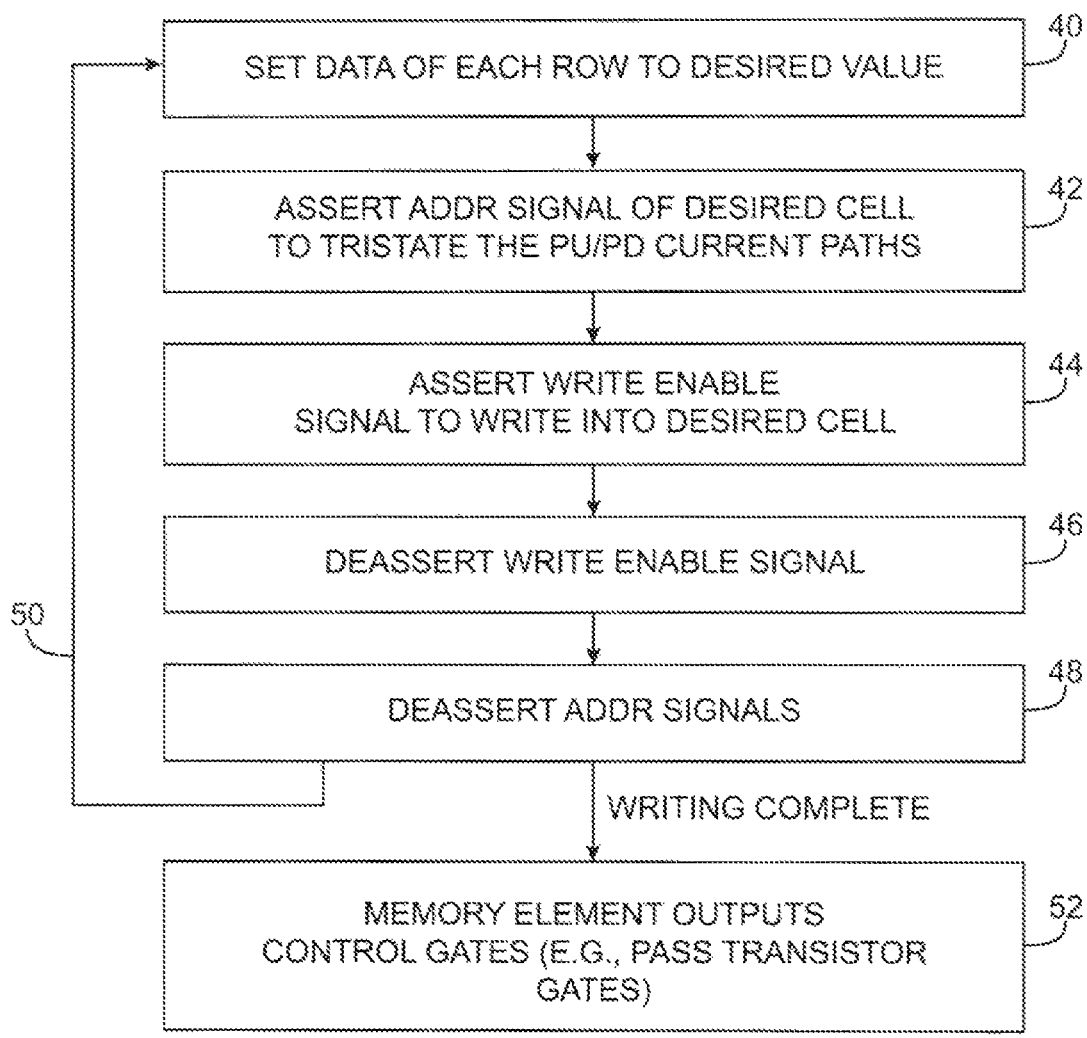
FIG. 11 is a flow chart of illustrative steps involved in writing data into a memory cell in accordance with an embodiment of the present invention.

FIG. 11 shows illustrative steps involved in operating memory cell 18 in the write mode. At step 40, integrated circuit 10 may set signal DATA of each row in memory array 17 to a desired value. At step 42, address signals ADD and ADDB corresponding to a desired cell may be asserted to place a column of memory cells in the tri-state mode (e.g., the pull-up and pull-down current paths of the second and fourth inverter-like circuits in the storage portion of cell 18 are disabled).

At step 44, the write enable signals (e.g., signals RW/RWB, nRW, etc.) may be asserted to enable write access transistors (if any) to write into the memory cell. Once the cell has been written with the desired value, the write enable signal can be deasserted (step 46). The address signals may then be deasserted (step 48).

Each column of memory cells in memory array 17 may be written in this way. If more memory cells need to be loaded with desired data, processing may loop back to step (as indicated by path 50) to write a next column of memory cells in. Once all the cells are loaded with the desired data, the memory cells may be place in normal operation. As an example, memory cells in a programmable integrated circuit may be loaded with configuration data to provide static output signals that control pass transistor gates (step 52).

Figure 12:
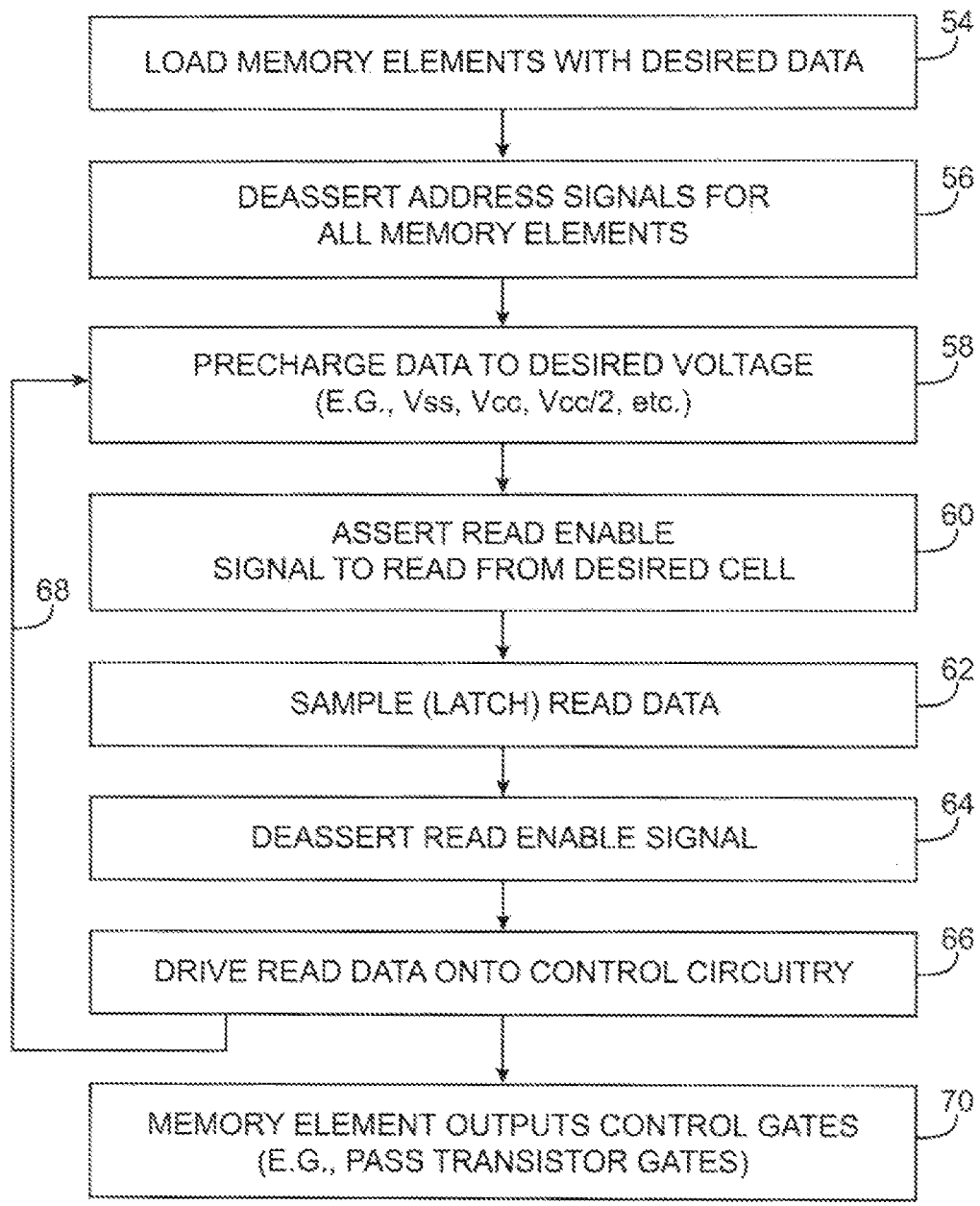
FIG. 12 is a flow chart of illustrative steps involved in reading data from a memory cell in accordance with an embodiment of the present invention.

FIG. 12 shows illustrative steps involved in operating memory cell 18 in the read mode. At step 54, memory cells 18 may be loaded with desired data using an approach of the type described in connection with FIG. 11. Address signals ADD and ADDB may be deasserted during the read mode (step 56). Deasserting the address signals during a read operation may allow the four inverter-like circuits to operate properly to provide high read stability and soft error upset immunity.

At step 58, the data line may be precharged to a desired precharge voltage (e.g., Vss, Vcc, Vcc/2, etc.). As an example, signal DATA may have a value of Vcc/2 to reduce overall power consumption. At step 60, the read enable signals (e.g., signals, RW/RWB, nRW, READ, etc.) corresponding to a desired cell in a column may be asserted to enable the read access transistors to charge or discharge the data line depending on the value of the stored bit.

At step 62, the read data may be sampled (latched) to capture the state of the stored bit. After the desired data has been sampled, the read enable signals may be deasserted (step 62). The read data may then be driven onto control circuitry 12 for further processing (step 66).

Each column of memory cells in memory array 17 may be read out in this way. If more memory cells need to be read, processing may loop back to step 58 as indicated by path 68 to read a next group of memory cells. Once all desired cells have been read, the memory cells may be used in their normal operating mode to provide static output signals that control circuit components such as programmable logic gates (step 70).

The foregoing is merely illustrative of the principles of this invention and various modifications can be made by those skilled in the art without departing from the scope and spirit of the invention.

What is claimed is:

1. A memory element operable in read and write modes, comprising:
   at least first and second transistor pairs that are interconnected to form a bistable element having at least first and second data storage nodes, each data storage node being coupled between a first transistor and a second transistor in a respective one of the first and second transistor pairs;
   a given transistor connected in series with the first transistor and the second transistor in a given one of the first and second transistor pairs; and
   an access circuit, wherein the access circuit is enabled to write data into the memory element during the write mode and wherein the access circuit is disabled during the read mode, wherein the access circuit is coupled to a selected one of the first and second data storage nodes, and wherein the access circuit and the given transistor are controlled using an address signal.

2. The memory element defined in claim 1, wherein the access circuit comprises a p-channel transistor.

3. The memory element defined in claim 1, wherein the access circuit comprises an n-channel transistor.

4. The memory element defined in claim 1, further comprising a read circuit, wherein the read circuit is enabled and reads data out of the memory element during the read mode and wherein the read circuit is disabled during the write mode.

5. The memory element defined in claim 4, wherein the read circuit comprises first and second transistors that are connected in series and wherein the first transistor has a gate that is connected to a given one of the first and second data storage nodes.

6. The memory element defined in claim 4, wherein the read circuit comprises an n-channel transistor.

7. The memory element defined in claim 4, further comprising:
   a third transistor pair that has a first transistor and a second transistor and a third data storage node coupled between the first transistor and the second transistor of the third transistor pair; and
   a fourth transistor pair that has a first transistor and a second transistor and a fourth data storage node coupled between the first transistor and the second transistor of the fourth transistor pair.

8. A memory element operable in read and write modes, comprising:
   at least first and second transistor pairs that are interconnected to form a bistable element having at least first and second data storage nodes, each data storage node being coupled between a first transistor and a second transistor in a respective one of the first and second transistor pairs;
   a given transistor connected in series with the first transistor and the second transistor in a given one of the first and second transistor pairs; and
   an access circuit, wherein the access circuit is enabled to write data into the memory element during the write mode and wherein the access circuit is disabled during the read mode, wherein the access circuit is coupled to a selected one of the first and second data storage nodes, and wherein the access circuit comprises an n-channel transistor and a p-channel transistor connected in parallel.

9. A memory element operable in read and write modes, comprising:
   at least first and second transistor pairs that are interconnected to form a bistable element having at least first and second data storage nodes, each data storage node being coupled between a first transistor and a second transistor in a respective one of the first and second transistor pairs;
   a given transistor connected in series with the first transistor and the second transistor in a given one of the first and second transistor pairs;
   an access circuit, wherein the access circuit is enabled to write data into the memory element during the write mode and wherein the access circuit is disabled during the read mode, wherein the access circuit is coupled to a selected one of the first and second data storage nodes; and
   a read circuit, wherein the read circuit is enabled and reads data out of the memory element during the read mode and wherein the read circuit is disabled during the write mode, wherein the read circuit comprises an n-channel transistor and a p-channel transistor connected in parallel.

10. A memory element operable in read and write modes, comprising:
    at least first and second transistor pairs that are interconnected to form a bistable element having at least first and second data storage nodes, each data storage node being coupled between a first transistor and a second transistor in a respective one of the first and second transistor pairs;

a given transistor connected in series with the first transistor and the second transistor in a given one of the first and second transistor pairs;

a data line;

a first access circuit coupled between the data line and the first data storage node;

a second access circuit coupled between the data line and the second data storage node, wherein the first and second access circuits are turned on during the write mode and wherein the first and second access circuits are turned off during the read mode; and a read circuit that is separate from the first and second access circuits, wherein the read circuit and the given transistor are turned off during the write mode and wherein the read circuit and the given transistor are turned on during the read mode.

11. The memory element defined in claim 10, wherein the read circuit comprises first and second transistors that are connected in series.

12. The memory element defined in claim 11, wherein the first transistor of the read circuit has a gate that is connected to a given one of the first and second data storage nodes.

13. The memory element defined in claim 10, the bistable element further comprising third and fourth data storage nodes.

14. The memory element defined in claim 13, wherein the read circuit comprises first and second transistors that are connected in series and wherein the first transistor of the read circuit has a gate that is connected to a given one of the third and fourth data storage nodes.

15. A memory element operable in read and write modes, comprising:

a bistable element having at least first and second data storage nodes;

a data line;

a first access circuit coupled between the data line and the first data storage node;

a second access circuit coupled between the data line and the second data storage node, wherein the first and second access circuits are turned on during the write mode and wherein the first and second access circuits are turned off during the read mode; and a read circuit that is separate from the first and second access circuits, wherein the read circuit is turned off during the write mode and wherein the read circuit and the given transistor are is turned on during the read mode, wherein the first and second access circuits each comprise an n-channel transistor and a p-channel transistor connected in parallel.

16. The memory element defined in claim 15, wherein the read circuit comprises first and second transistors that are connected in series.

17. The memory element defined in claim 16, wherein the first transistor of the read circuit has a gate that is connected to a given one of the first and second data storage nodes.

18. A memory element operable in read and write modes, comprising:

a data line;

a bistable element having at least first and second data storage nodes, wherein the bistable element includes at least one transistor and wherein the transistor is controlled to selectively weaken the bistable element during the write mode; and an access circuit coupled between the data line and the first data storage node, wherein the access circuit is turned on during the write mode and wherein the access circuit is turned off during the read mode.

19. The memory element defined in claim 18, further comprising first and second power supply terminals, wherein the transistor is coupled between the first power supply terminal and a given one of the first and second data storage nodes and wherein during the write mode the transistor is turned off and weakens the bistable element by disconnecting the given one of the first and second data storage nodes from the first power supply terminal.

20. The memory element defined in claim 18, further comprising circuitry coupled between the data line and the second data storage node, wherein the circuitry is turned off during the write mode and wherein the circuitry is turned on during the read mode.

* * * * *